United States Patent
Kumar et al.

(10) Patent No.: US 6,759,286 B2
(45) Date of Patent: Jul. 6, 2004

(54) METHOD OF FABRICATING A GATE STRUCTURE OF A FIELD EFFECT TRANSISTOR USING A HARD MASK

(76) Inventors: Ajay Kumar, 510 Kenilworth Ct., Sunnyvale, CA (US) 94087; Padmapani C. Nallan, 2200 Pettigrew Dr., San Jose, CA (US) 95148

(*) Notice: Subject to any disclaimer, the term of this patent is extended or adjusted under 35 U.S.C. 154(b) by 0 days.

(21) Appl. No.: 10/245,130

(22) Filed: Sep. 16, 2002

(65) Prior Publication Data

US 2004/0053484 A1 Mar. 18, 2004

(51) Int. Cl.$^7$ .............................. H01L 21/338
(52) U.S. Cl. ............... 438/177; 438/719; 438/723; 438/743; 438/712; 438/714; 438/715; 438/717
(58) Field of Search ................ 438/177, 158, 438/783, 151, 117, 719, 723, 743, 712, 714, 715, 717, 720, 721, 700, 701, 734, 706, 287, 197

(56) References Cited

U.S. PATENT DOCUMENTS

| | | | |
|---|---|---|---|
| 6,037,265 A | * 3/2000 | Mui et al. | 438/719 |
| 6,221,784 B1 | * 4/2001 | Schmidt et al. | 438/719 |
| 6,461,974 B1 | * 10/2002 | Ni et al. | 438/712 |
| 6,579,809 B1 | * 6/2003 | Yang et al. | 438/734 |

* cited by examiner

*Primary Examiner*—Caridad Everhart
*Assistant Examiner*—Igwe U. Anya

(74) *Attorney, Agent, or Firm*—Moser, Patterson & Sheridan, NJ; Joseph Bach

(57) ABSTRACT

A method of fabricating a gate structure of a field effect transistor, comprising forming a hard mask, etching a gate electrode, and contemporaneously forming a gate dielectric and removing the hard mask.

42 Claims, 9 Drawing Sheets

METHOD OF FABRICATING A GATE STRUCTURE OF A FIELD EFFECT TRANSISTOR USING A HARD MASK

BACKGROUND OF THE INVENTION

1. Field of the Invention

The present invention generally relates to a method for fabricating devices on semiconductor substrates. More specifically, the present invention relates to a method for fabricating a gate structure of a field effect transistor.

2. Description of the Related Art

Ultra-large-scale integrated (ULSI) circuits typically include more than one million transistors that are formed on a semiconductor substrate and cooperate to perform various functions within an electronic device. The transistors generally are complementary metal-oxide-semiconductor (CMOS) field effect transistors comprising a gate structure disposed between a source region and a drain region that are formed in the semiconductor substrate. The gate structure comprises a gate electrode and a gate dielectric. The gate electrode is provided over the gate dielectric and controls a flow of charge carriers in a channel region formed between the drain and the source regions to turn the transistor on or off. There is a constant trend to reduce a width of the channel region, as well as the width of the gate structure to thereby increase the overall speed of the transistor.

The topographic dimensions of a feature (i.e., transistor component or element such as a width of the gate structure) decrease as the number of transistors in the ULSI circuit increases. In a conventional fabrication process, a lithographically patterned photoresist mask is used during etch and deposition processes to form transistor components (e.g., an element of a field effect transistor such as a gate structure and the like). Consequently, a thickness of the photoresist mask also decreases as the feature becomes smaller. As such, the lithographic techniques become unable to precisely and accurately define the feature. For example, a thickness of the photoresist mask is limited to about 3000 Angstroms during fabrication of a feature having the topographic dimensions of about 0.13 $\mu$m. The designs utilizing features with the dimensions smaller than 0.13 $\mu$m require even thinner photoresist mask to transfer a pattern of the feature onto a layer on the substrate. Such photoresist masks are so thin that they cannot provide precise dimensional control of the features being formed or adequate protection to the underlying layers during plasma etch processes, e.g., processes used to form the gate structure of a field effect transistor.

Therefore, here is a need in the art for a method of fabricating narrow gate structure.

SUMMARY OF THE INVENTION

The present invention is a method of fabricating a gate structure of a field effect transistor (FET). The method comprises forming a hard mask upon the gate electrode layer, plasma etching a gate electrode, and contemporaneously forming a gate dielectric, as well as removing the hard mask using a plasma etch process. In one embodiment, the hard mask is formed to thickness of about 100 to 300 Angstroms and comprises at least one metal such as Al, Ti, W, Ta, and the like, or at least one dielectric such as $HfO_2$, $HfSiO_2$, $Al_2O_3$, and the like.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

It is to be noted, however, that the appended drawings illustrate only typical embodiments of this invention, and are therefore not to be considered limiting of its scope, for the invention may admit to other equally effective embodiments.

DETAILED DESCRIPTION

The present invention is a method of fabricating a gate structure of a field effect transistor (FET) on a semiconductor substrate. The method comprises forming an ultra-thin hard mask upon the gate electrode layer using a sputter etch process, plasma etching a gate electrode, and contemporaneously forming a gate dielectric while removing the hard mask using a plasma etch process. The invention may be used during fabrication of features such as gate structures and the like having a width of about 0.13 $\mu$m or less. The terms substrate and wafer are used interchangeably herein.

A gate structure comprises a gate electrode and a gate dielectric. The gate electrode is typically formed from polysilicon (Si), while the gate dielectric typically comprises at least one dielectric, such as hafnium dioxide ($HfO_2$), $HfSiO_2$, silicon dioxide ($SiO_2$), and the like. In one embodiment, the hard mask comprises an "ultrathin" layer of at least one metal such as aluminum (Al), titanium (Ti), tungsten (W), tantalum (Ta), and the like, or at least one dielectric such as $HfO_2$, $HfSiO_2$, alumina ($Al_2O_3$), and the like, and is formed to a thickness of about 100 to 300 Angstroms. The processes of sputter etching the ultra-thin hard mask, plasma etching the gate electrode, and simultaneous forming the gate dielectric and removing the ultra-thin hard mask may be performed in a single reactor.

Material of the ultra-thin hard mask is selected to provide high selectivity for a material of the gate electrode, e.g., polysilicon, during a plasma etch process that forms the gate electrode. High selectivity of material of the hard mask, e.g., about 100:1, enable the use of the ultra-thin hard masks of the present invention.

Further, in one embodiment, during the plasma etch process forming the gate dielectric, the material of the ultra-thin hard mask has about the same or higher etch rate as the material of a gate dielectric layer, while having a selectivity of at least 3:1 for the material of the gate electrode and the substrate (e.g., a silicon wafer). In this embodiment, the ultra-thin hard mask may be simultaneously removed during such etch process.

Figure 1A:
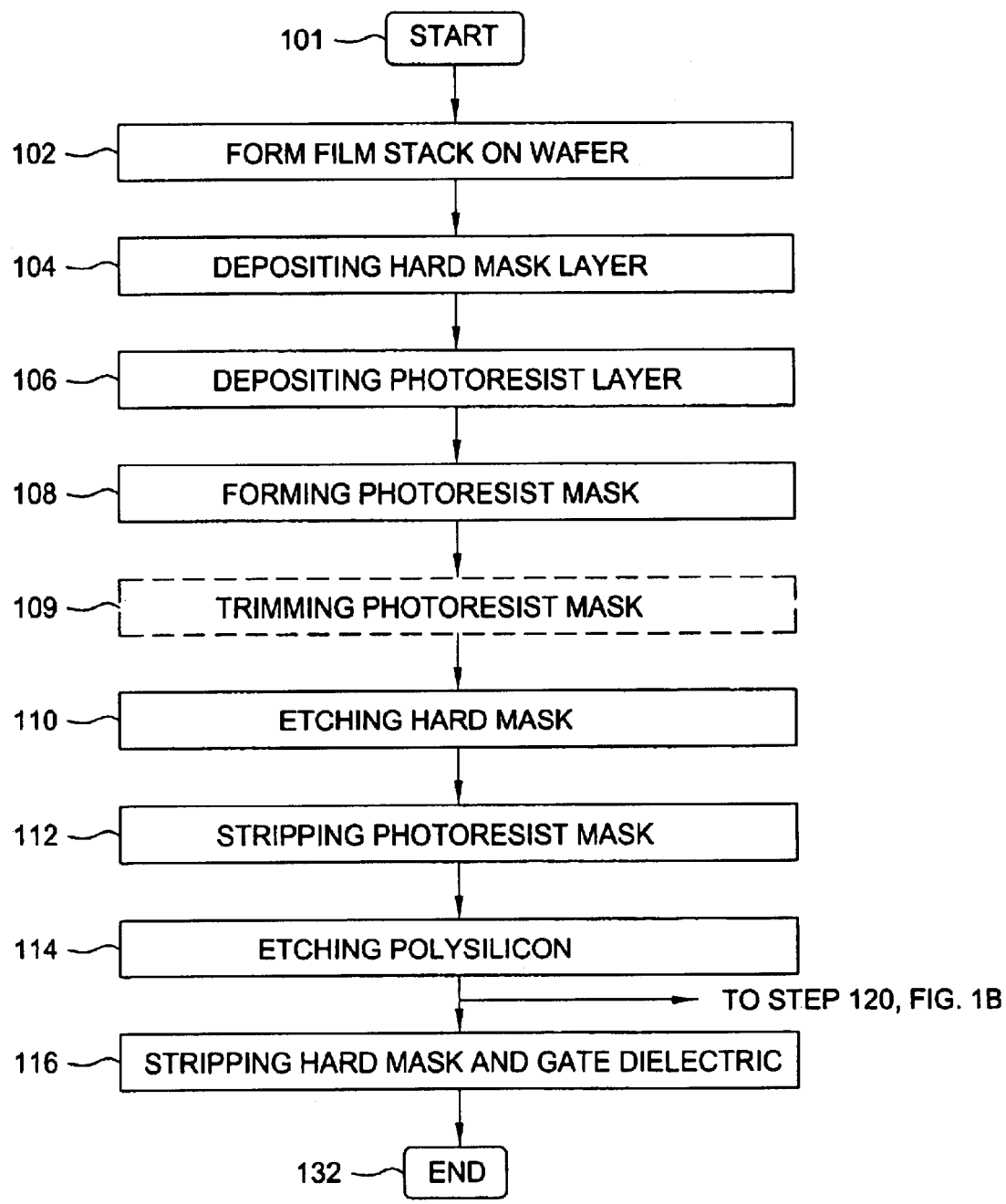
FIGS. 1A and 1B together depict a flow diagram of a method of fabrication a gate structure in accordance with the present invention.
Figure 1B:
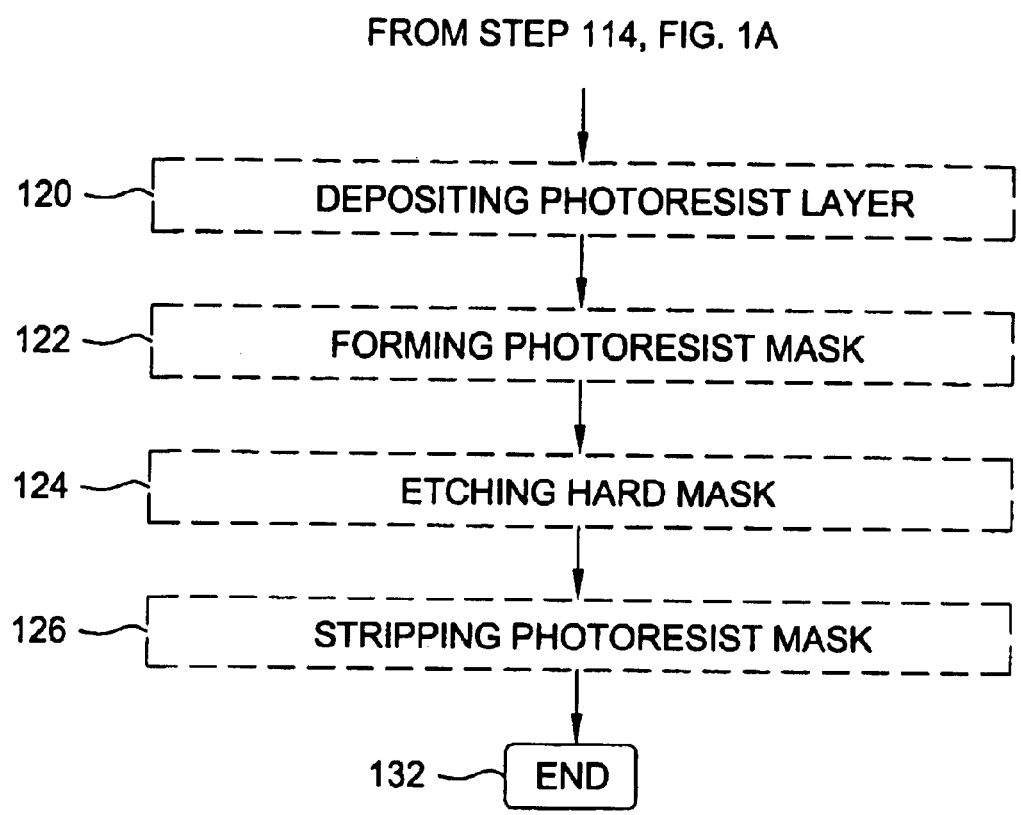

FIGS. 1A and 1B together depict a flow diagram of a method of fabrication a gate structure in accordance with the present invention as a sequence 100. The method 100 comprises processes that are performed upon a film stack of the gate structure during fabrication of the FET (e.g., CMOS transistor).

FIGS. 2A–2L together depict a sequence of schematic, cross-sectional views of a substrate having a gate structure being formed in accordance with the method 100 of FIG. 1. The cross-sectional views in FIGS. 2A–2L relate to individual process steps that are used to form the gate structure. Sub-processes such as lithographic processes (e.g., exposure and development of photoresist, and the like), and wafer cleaning procedures among others are well known in the art and, as such, are not shown in FIGS. 1A, 1B and FIGS. 2A–2L. The images in FIGS. 2A–2L are not depicted to scale and are simplified for illustrative purposes.

Figure 2A:
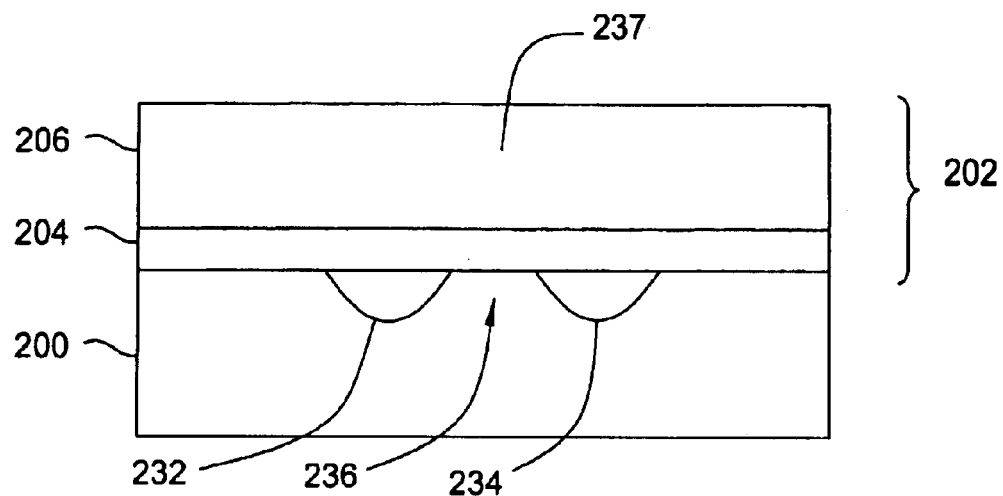
FIGS. 2A–2L together depict a sequence of schematic, cross-sectional views of a substrate having a gate structure being formed in accordance with the method of FIG. 1.

The method 100 starts at step 101 and proceeds to step 102, when a film stack 202 is formed on a wafer 200 (FIG. 2A). The wafer 200, e.g., a silicon (Si) wafer, comprises doped source and drain regions (wells) 232 and 234 that are separated by a channel region 236 of a transistor 237. The film stack 202 generally comprises an electrode layer 206 and a dielectric layer 204. In one embodiment, the electrode layer 206 is a doped polysilicon (Si) layer formed to a thickness of about 500 to 2000 Angstroms. The dielectric layer 204 may be a layer of hafnium dioxide, $HfSiO_2$, silicon dioxide, and the like that is generally formed to a thickness of about 10 to 30 Angstroms. It should be understood, however, that the film stack 202 may comprise layers that are formed from other materials or layers having a different thickness.

Figure 2B:
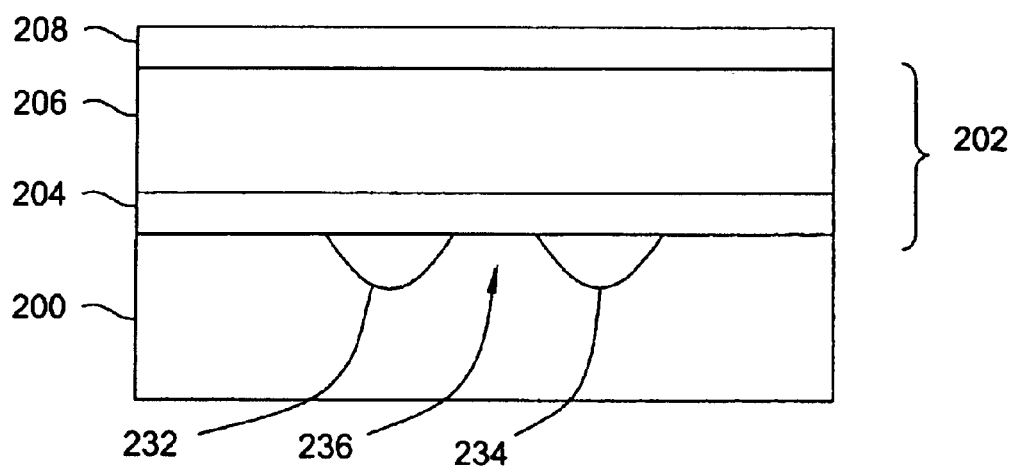

At step 104, an ultra-thin hard mask layer 208 is applied upon the polysilicon layer 206 (FIG. 2B). The layer 208 is typically formed to a thickness in a range between 100 to 300 Angstroms and comprises at least one of dielectrics such as hafnium dioxide, alumina ($Al_2O_3$), and the like, or at least one of metals such as Al, Ti, W, Ta, and the like. In one exemplary embodiment, the layer 208 is formed from hafnium dioxide and may comprise dopants such as nitrogen ($N_2$) and the like. Alternatively, the layer 208 may comprise one or more additional sub-layers, e.g., a thin layer (monolayer) of silicon dioxide (not shown) formed upon the polysilicon layer 206.

The layers forming the stack 202 may be provided using a vacuum deposition technique such as an atomic layer deposition (ALD), a physical vapor deposition (PVD), a chemical vapor deposition (CVD), plasma enhanced CVD (PECVD), evaporation, and the like. Processes used during fabrication of the gate structure may be performed, for example, using the deposition processing modules of a CENTURA® semiconductor wafer processing system, which is available from Applied Materials, Inc. of Santa Clara, Calif.

Figure 2C:
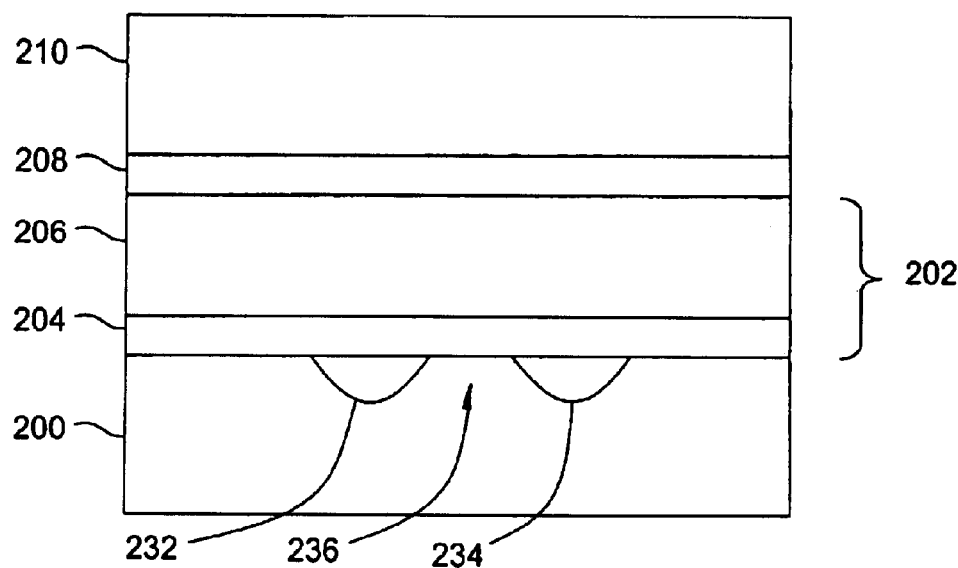

At step 106, a photoresist layer 210 is formed upon the ultra-thin hard mask layer 208 (FIG. 2C). Further, the photoresist layer 210 may comprise a sub-layer (not shown) of an anti-reflective coating (ARC) or a bottom anti-reflective coating (BARC) that is used to control a reflection of light during an exposure of the photoresist layer. The ARC or BARC sub-layer may be composed, for example, from inorganic materials such as silicon nitride ($Si_3N_4$), silicon carbide (SiC), and the like. Alternatively, the ARC or BARC sub-layer may be composed from organic materials such as polyamides and polysulfones. As a feature size is reduced, inaccuracies in a pattern transfer process can arise from optical limitations inherent to the lithographic process, such as the light reflection. When applied, the ARC sub-layer is formed upon the photoresist layer 210, and the BARC sub-layer is formed upon the layer 208. The photoresist layer 210 is applied using a conventional procedure and generally has a total thickness of less than 3000 Angstroms.

Figure 2D:
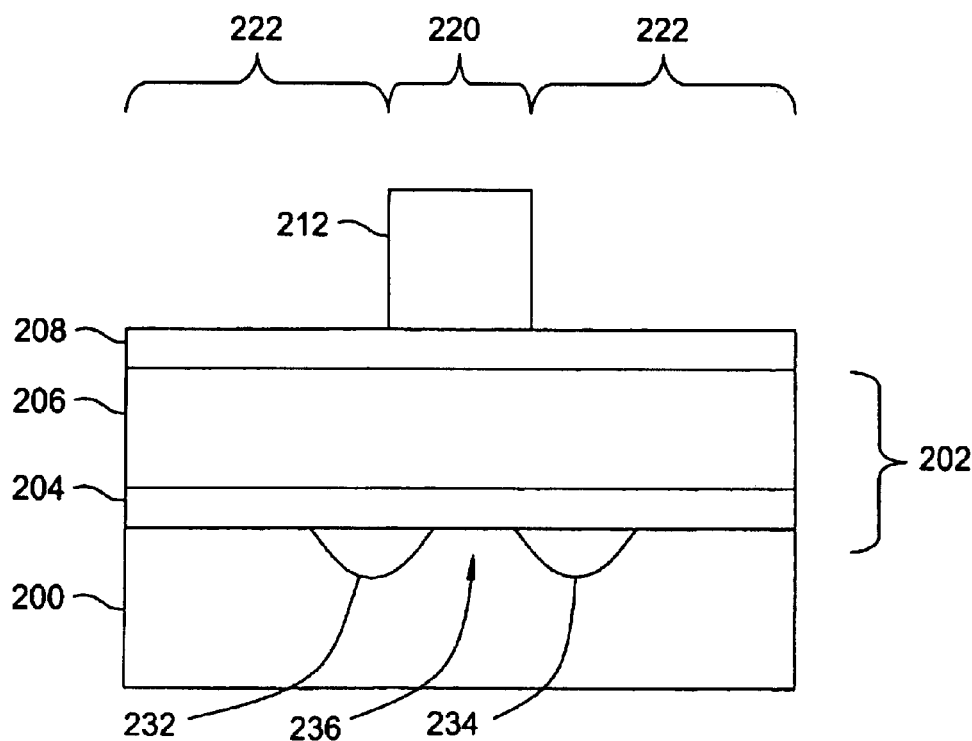

At step 108, the photoresist layer 210 is processed using a conventional lithographic patterning process. During the patterning process, the photoresist layer 210 is exposed through a patterned mask and developed, while an undeveloped portion of the photoresist is removed (FIG. 2D). A remaining developed photoresist is generally a polymer that forms a mask 212. The mask 212 rests over the layer 208 in the region 220 that is protected during the etch processes of the present invention, as discussed below. The region 220 is defined above the well regions 232 and 234 and the channel region 236. Specifically, the region 220 is defined as being wider than the channel region 236 so as to cover the adjacent portions of the well regions 232 and 234.

At optional step 109, the mask 212 may be isotropically etched to reduce its topographic dimensions, specifically, to reduce the width, e.g., to about 0.07 μm. Step 109 typically uses a conventional photoresist trimming process, such as a plasma etch process. The trimming process is used when, during step 108, a resolution of the lithographic patterning process is insufficient for a transferring an exact image of the gate structure into the layer 210.

Figure 2E:
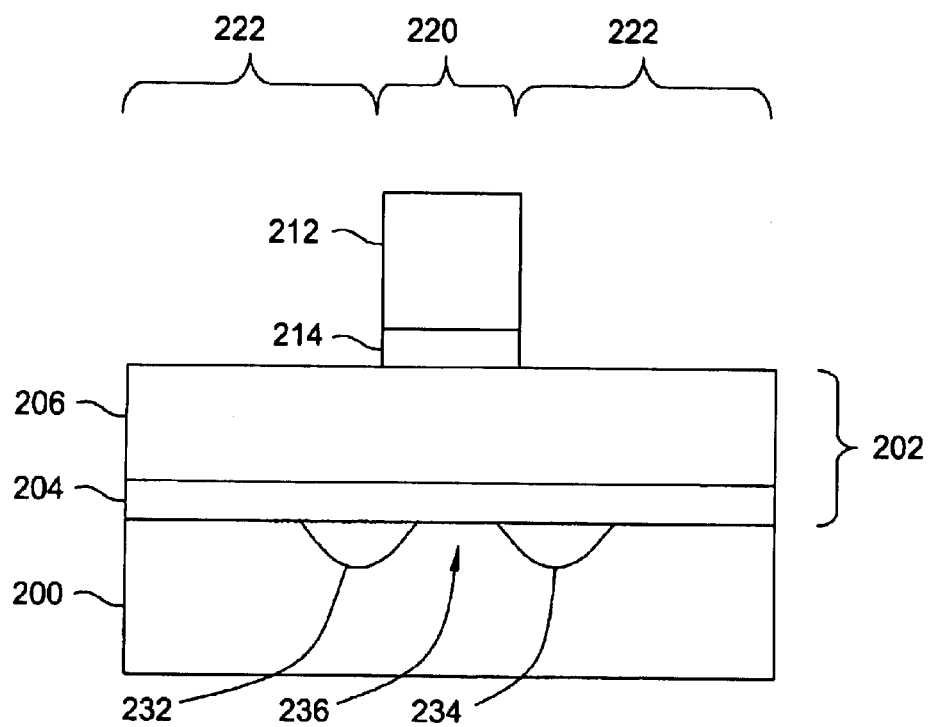

At step 110, the layer 208 is removed in the regions 222 around the region 220 using an etch process. A remaining portion of the layer 208 defines an ultra-thin hard mask 214, formed upon the electrode layer 206 in the region 220 (FIG. 2E). In one embodiment, step 110 uses the mask 212 as an etch mask, and the polysilicon layer 206 as an etch stop layer. In an exemplary embodiment, the etch process of step 110 is performed by a plasma generated from a gas (or gas mixture) comprising at least one of argon (Ar) or oxygen ($O_2$).

Step 110 can be accomplished in a Decoupled Plasma Source (DPS) II module of the Centura® system. In the DPS II reactor, the ion density and ion energy may be controlled independently using a plasma power source and biasing power source, respectively. The plasma power source generates and sustains a high density plasma, while the biasing power source electrically biases the wafer. The DPS II module provides a wide process window over changes in plasma and biasing powers, etch gas chemistry and pressure, wafer temperature, and the like. The process time can be terminated, for example, by using an endpoint detection system to detect a particular optical emission, upon a particular duration occurring, or upon some other indicator suitable for determining the end of the etch process.

In one embodiment, during etching the ultra-thin hafnium dioxide layer 208 in the DPS II module, step 110 provides argon at a rate of 10 to 200 sccm, as well as chlorine at a rate of 10 to 200 sccm and carbon monoxide a rate of 10 to 200 sccm (i.e., flow ratio between the gases ranges from 1:1 to 1:20), applies 200 to 3000 W of a plasma power and 0 to 300 W of a biasing power, maintains a wafer temperature at 10 to 100 degrees Celsius, and a pressure in the reaction chamber at 2 to 100 mtorr. One specific process recipe provides Ar at a rate of 50 sccm, $Cl_2$ at a rate of 50 sccm, CO at a rate of 50 sccm resulting in Ar:$Cl_2$:CO flow ratio of 1:1:1, 1000 W from a plasma power source and 100 W from a biasing power source, a wafer temperature of 80 degrees Celsius, and a chamber pressure of 4 mtorr.

Figure 2F:
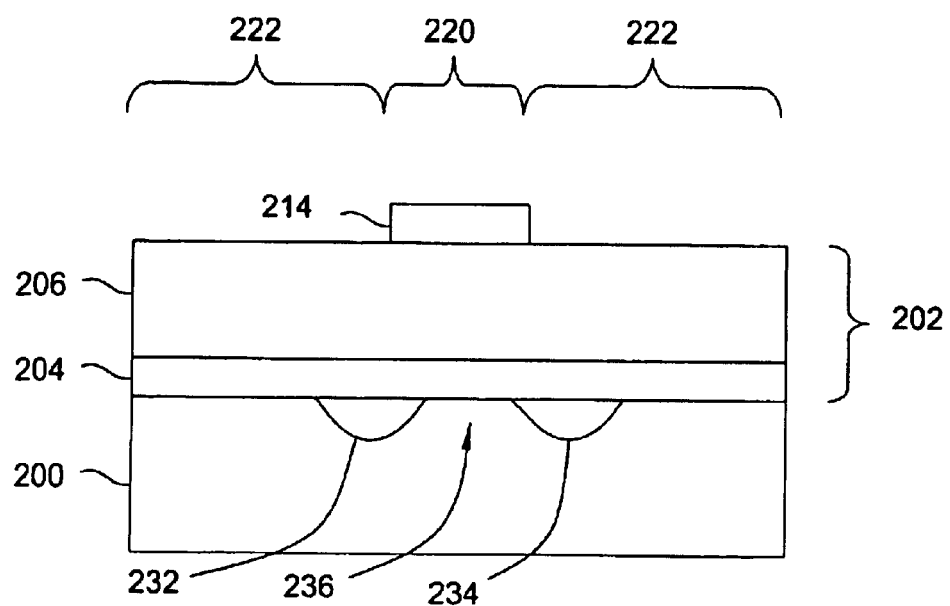

At step 112, the mask 212 is removed, or stripped, thus leaving the ultrathin hard mask 214, e.g., a hafnium dioxide hard mask, on top of the film stack 202 (FIG. 2F). In one embodiment, step 112 uses the mask 214 as an etch stop layer. Step 112 generally performs a stripping process that uses a plasma generated from a gas (or gas mixture) comprising oxygen. In one embodiment, step 112 uses oxygen that is supplied into a reaction chamber in conjunction with nitrogen ($N_2$). Further, nitrogen may optionally be mixed with one or more inert gases such as helium ($He_2$) and the like.

Step 112 may be performed, for example, in the DPS II module or in an Advanced Strip and Passivation (ASP) module of the CENTURA® system. Alternatively, step 112 may be performed using a wet etch process.

The ASP module is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. In the ASP module, a wafer backside is heated radiantly by quartz halogen lamps and the wafer temperature can be maintained at 20 to 400 degrees Celsius. A duration of a stripping process is generally between 30 and 120 seconds. Similar to the DPS II module, the ASP module may include an endpoint detection system.

In one embodiment, when the stripping process is performed in the DPS II module, step 112 provides oxygen at a rate of 10 to 200 sccm, as well as nitrogen ($N_2$) at a rate of 0 to 200 sccm, applies 200 to 3000 W of a plasma power and 0 to 300 W of a biasing power, maintains a wafer temperature at 10 to 80 degrees Celsius, and a pressure in the reaction chamber at 2 to 100 mtorr. One specific process recipe provides $O_2$ at a rate of 50 sccm and $N_2$ at a rate of 50 sccm, 1000 W from a plasma power source and 10 W from a biasing power source, a wafer temperature of 50 degrees Celsius, and a chamber pressure of 4 mtorr.

In another embodiment, when the stripping process is performed in the ASP module, step 112 provides oxygen at a rate 1000 to 7500 sccm, as well as nitrogen ($N_2$) at a rate of 0 to 500 sccm, applies a microwave power of 500 to 2500 W, maintains a wafer temperature at 100 to 250 degrees Celsius, and a pressure in the reaction chamber at 1 to 10 Torr. One specific process recipe provides $O_2$ at a rate of 3500 sccm and $N_2$ at a rate of 500 sccm, a microwave power of 1400 W, a wafer temperature of 200 degrees Celsius, and a chamber pressure of 2 Torr.

In a further embodiment, during step 112, the stripping process may be performed in a wet cleaning module using a treatment in a SC1 solvent followed by a rinse in distilled water. The SC1 solvent is commercially available from Rhodia, Inc., Freeport, Tex. and other suppliers. The SC1 solvent comprises, by weight, about (0.1–10) parts of ammonium hydroxide ($NH_4OH$), (0.1–10) parts of hydrogen peroxide ($H_2O_2$), and (1–100) parts of deionized water ($H_2O$). After the treatment, the wafer 200 is rinsed in distilled water to remove any remaining traces of the SC1 solvent. Step 112 applies the solvent at a temperature of about 45 to 65 degrees Celsius for a duration of about 30 to 120 seconds. One specific solvent recipe comprises 1 part of $NH_4OH$, 1 part $H_2O_2$, and 10 parts of deionized water. The stripping process may be performed in a conventional bath dip or in a single wafer cleaning module such as the TEMPEST™ module that is available from Applied Materials, Inc. of Santa Clara, Calif.

Figure 2G:
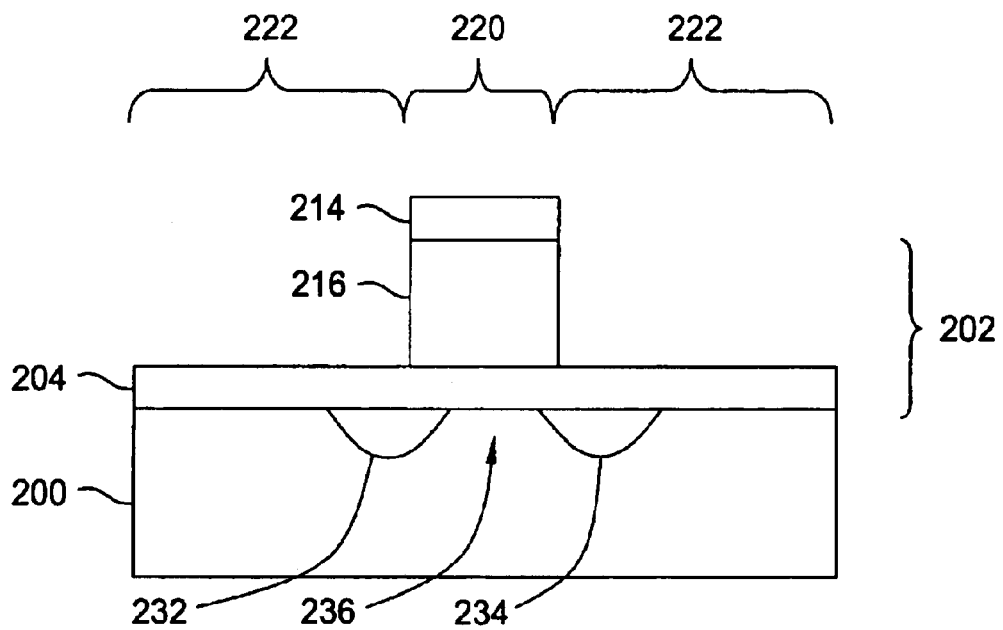

At step 114, the electrode layer 206 is removed in the regions 222. A remaining portion of the layer 206 forms a gate electrode 216, e.g., a polysilicon gate electrode, which rests upon the dielectric layer 204 (FIG. 2G). Step 114 uses the ultrathin hard mask 214, e.g., a hafnium dioxide mask, as an etch mask and the dielectric layer 204, e.g., also formed from the hafnium dioxide, as an etch stop layer. In one embodiment, step 114 may perform a plasma etch process using an etchant gas (or gas mixture) comprising one or several chlorinated/brominated/fluorinated chemistries such as $Cl_2$, HBr, $CF_4$, and the like. This etch process provides a relative selectivity to polysilicon over $HfO_2$, $HfSiC_2$, $Al_2O_3$, and the like of about 100:1 thus allowing to use the ultra-thin hard mask 214 formed, e.g., from hafnium dioxide, to thickness of about 100–300 Angstroms.

In one embodiment, when the etch process is performed in the DPS II module, step 114 provides HBr at a rate of 20 to 300 sccm, as well as chlorine ($Cl_2$) at a rate of 20 to 300 sccm ($HBr:Cl_2$ flow ratio ranges from 1:15 to 15:10) and nitrogen at a rate of 0 to 200 sccm, applies 200 to 3000 W of a plasma power and 0 to 300 W of a biasing power, maintains a wafer temperature at 100 to 500 degrees Celsius, and a pressure in the reaction chamber at 2 to 100 mtorr. One specific process recipe provides HBr at a rate of 40 sccm, $Cl_2$ at a rate of 40 sccm, and $N_2$ at a rate of 20 sccm ($HBr:Cl_2:N_2$ flow rate ratio of 2:2:1), 1100 W from a plasma power source and 20 W from a biasing power source, a wafer temperature of 350 degrees Celsius, and a chamber pressure of 4 mtorr.

Figure 2H:
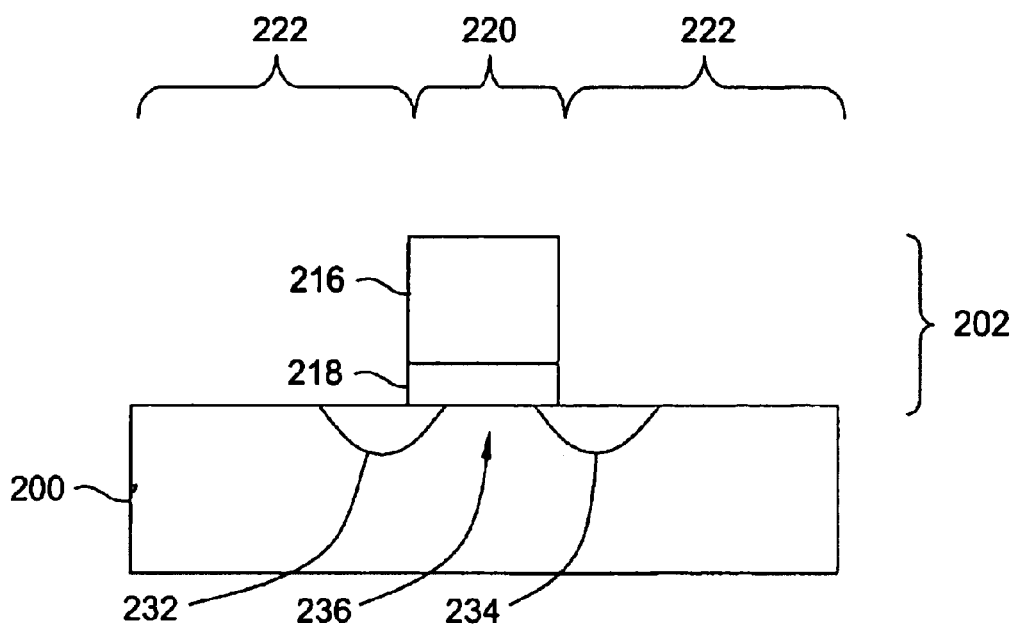
Figure 2I:
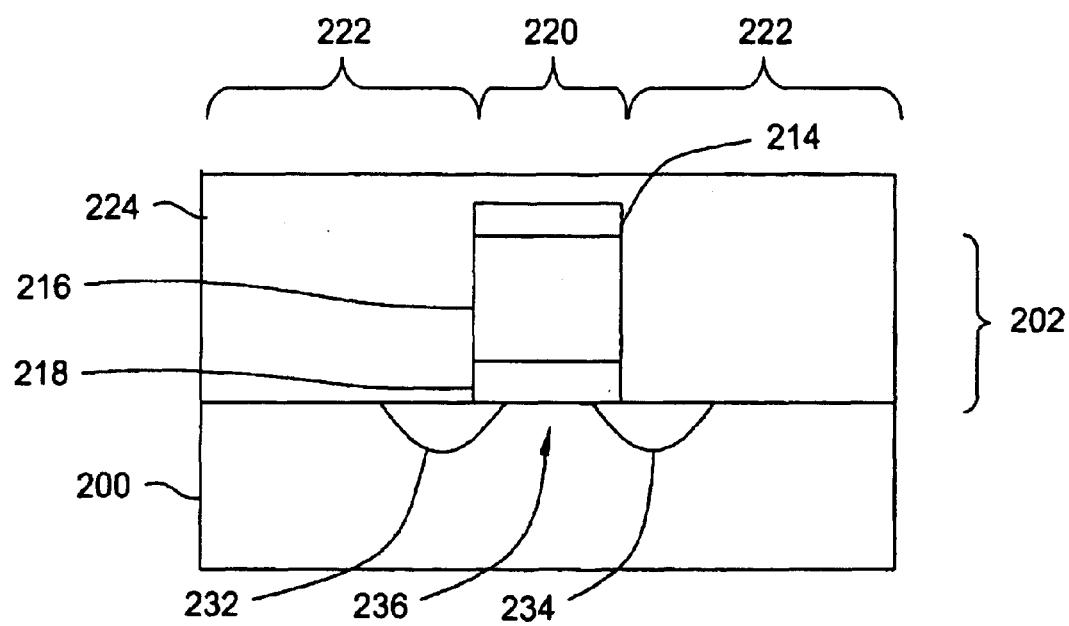
Figure 2J:
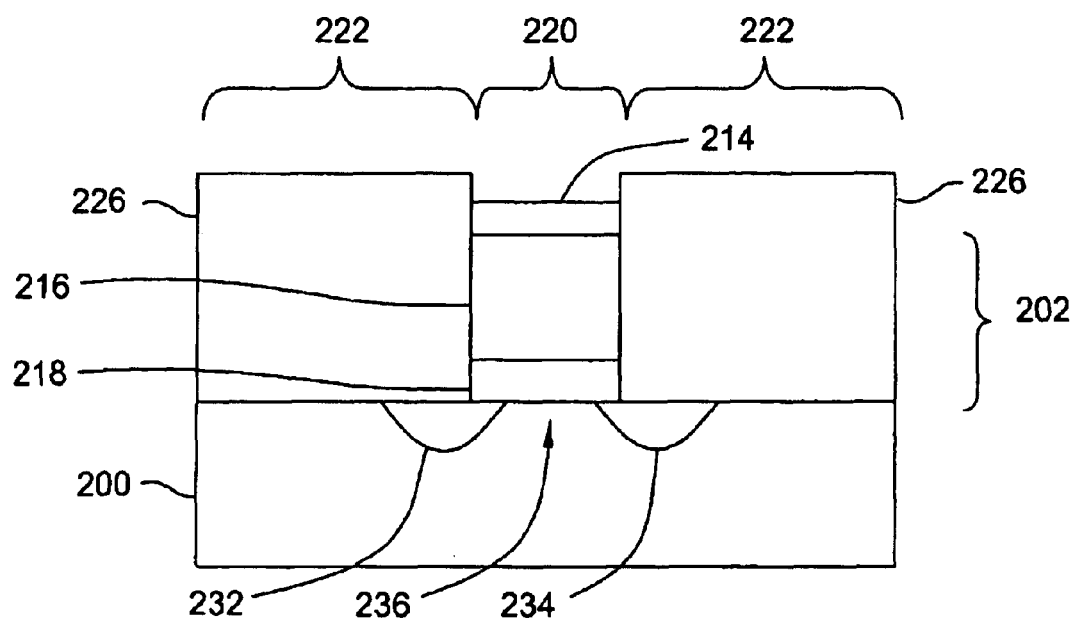
Figure 2K:
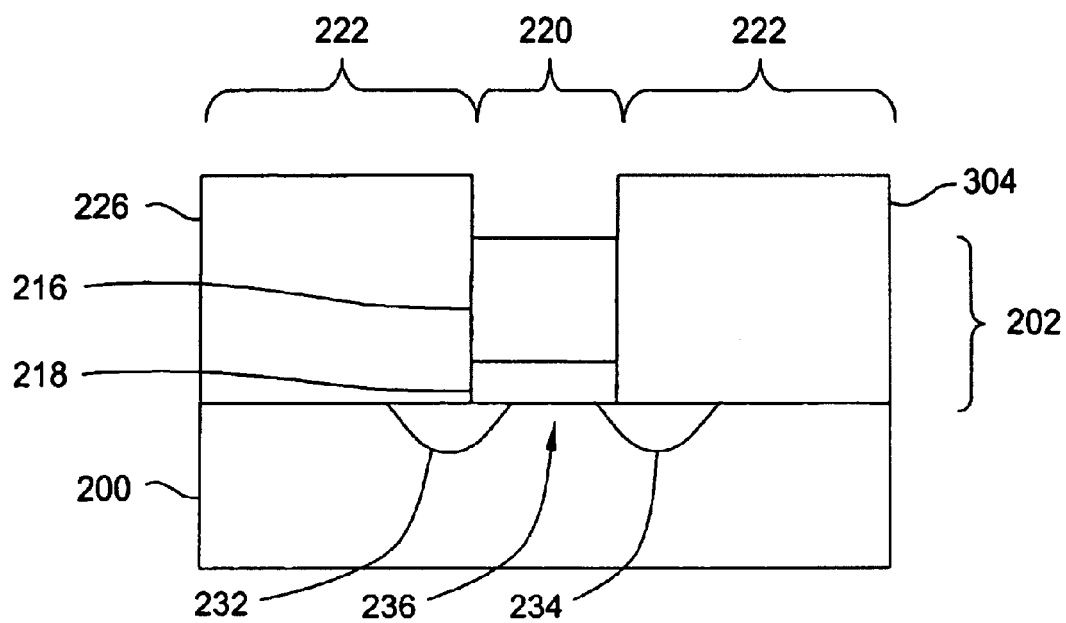
Figure 2L:
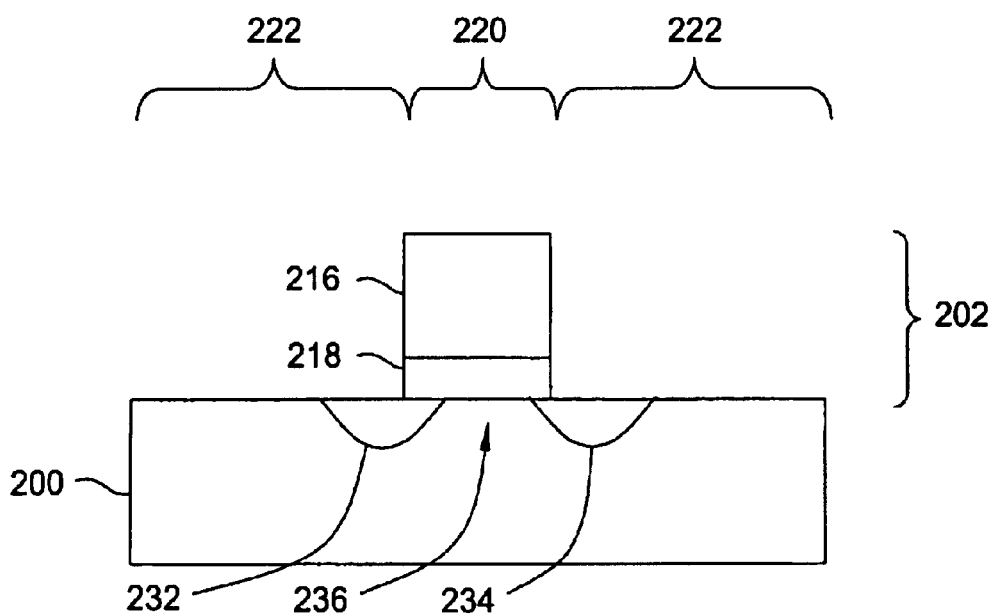

At step 116, the dielectric layer 204 is removed in the regions 222 using a plasma etch process. A remaining portion of the dielectric layer 204 forms a gate dielectric 218, e.g., a hafnium dioxide gate dielectric, in the region 220 upon the wafer 200 above the wells 232 and 234, and the channel 236. In one embodiment, when the ultra-thin hard mask 214 is formed from $HfO_2$, $HfSiO_2$, $Al_2O_3$, and the like, step 114 contemporaneously forms the gate dielectric 218 and removes the ultra-thin hard mask 214 from the gate electrode 216 (FIG. 2H). In this embodiment, the etch process comprises two phases. During a first phase, the dielectric layer 204 is removed in the regions 222, while the ultra-thin mask 214 performs as an etch mask and the wafer 200 performs as an etch stop layer. The mask 214 is partially consumed during a first phase. During a second phase, the remaining portion of the mask 214 is totally removed from the gate electrode 216. In one embodiment, both phases use the same process recipe and are performed with no interruption within a single etch process.

During both the first or the second phase, step 116 may use a plasma etch process comprising a plasma generated from an etchant gas (or gas mixture) containing a halogen gas such as chlorine ($Cl_2$), HCl, and the like, as well as a reducing gas such as carbon monoxide (CO). This etch process provides relative selectivity of $HfO_2$ to $SiO_2$ and the like of about 25:1 and to polysilicon and silicon of about 3:1 or greater. Such etch processes are disclosed in the commonly assigned U.S. patent application Ser. No. 10/194,566, filed Jul. 12, 2002 which is incorporated herein by reference.

DPS II module, step 118 provides chlorine at a rate of 2 to 300 sccm, BS well as and carbon monoxide at a rate of 2 to 200 sccm (a $Cl_2:CO$ flow ratio of between 1:100 and 150:1), applies 200 to 3000 W of a plasma power and 0 to 300 W of a biasing power, maintains a wafer temperature at 100 to 500 degrees Celsius, and a pressure in the reaction chamber at 2 to 100 mTorr. One specific process recipe provides $Cl_2$ at a rate of 40 sccm and CO at a rate of 40 sccm, 1100 W from a plasma power source and 20 W from a biasing power source, a wafer temperature of 350 degrees Celsius, and a chamber pressure of 4 mTorr.

Alternatively, the ultra-thin hard mask 214 may be formed from a material that is resistant to etchant plasma used during step 116, for example, when the mask 214 may have another useful application in the processes used during manufacturing of the FET. In this embodiment, the mask 214 may be removed, when desired, using an optional sequence 130, as shown in FIG. 1B. The sequence 130 comprises, at step 122, depositing a photoresist layer 224 (step 120, FIG. 1I) and, at step 122, patterning the layer 224 to form a photoresist mask 226 (FIG. 1J). At step 124, the mask 214 is etched and removed (FIG. 1K), and, at step 126, the mask 226 (FIG. 1L) is stripped. Steps 120, 122, 124, and 126 may use, for example, the processes described above in reference to steps 106, 108, 110, and 112, respectively. Alternatively, step 124 may use, e.g., a reactive ion etch (RIE) process or a wet etch process. At step 132, the method 100 ends.

Figure 3:
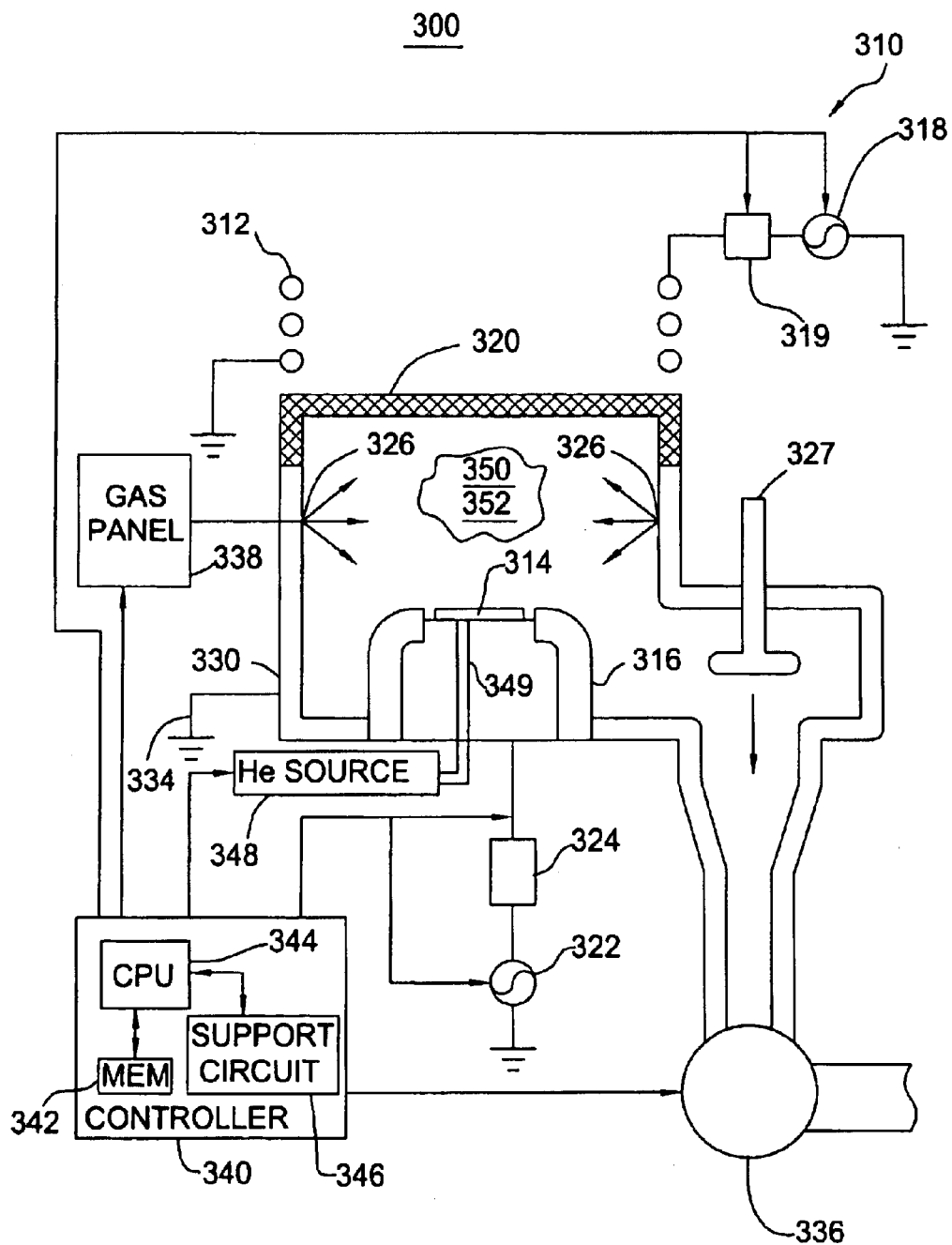
FIG. 3 depicts a schematic diagram of an exemplary plasma processing apparatus of the kind used in performing the method of FIG. 1.

FIG. 3 depicts a schematic diagram of a DPS II etch reactor 300 that may be uses to practice the inventive method 100. The reactor 300 comprises a process chamber 310 having a wafer support pedestal 316 within a conductive body (wall) 330, and a controller 340.

The support pedestal (cathode) 316 is coupled, through a first matching network 324, to a biasing power source 322. The biasing source 322 generally is capable of producing up to 500 W at a frequency of approximately 13.56 MHz. In other embodiments, the source 322 may be a DC or pulsed DC source. The wall 330 is supplied with a substantially flat dielectric ceiling 320. Other modifications of the chamber 310 may have other types of ceilings, e.g., a dome-shaped ceiling. Typically, the wall 330 is coupled to an electrical ground 334. Above the ceiling 320 is disposed an inductive coil antenna 312. The antenna 312 is coupled, through a second matching network 319, to a plasma power source 318. The plasma source 318 typically is capable of producing up to 3000 W at a tunable frequency in a range from 50 kHz to 13.56 MHz.

A controller 340 comprises a central processing unit (CPU) 344, a memory 342, and support circuits 346 for the CPU 344 and facilitates control of the components of the DPS etch process chamber 310 and, as such, of the etch process, as discussed below in further detail.

In operation, a semiconductor wafer 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the plasma and bias sources 318 and 322 to the antenna 312 and the cathode 316, respectively. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the wafer 314 is controlled by stabilizing a temperature of the support pedestal 316. In one embodiment, the helium gas from a gas source 348 is provided via a gas conduit 349 to channels formed by the back of the wafer 314 and grooves (not shown) in the pedestal surface. The helium gas is used to facilitate heat transfer between the pedestal 316 and the wafer 314. During the processing, the pedestal 316 may be heated by a resistive heater (not shown) within the pedestal to a steady state temperature and then the helium gas facilitates uniform heating of the wafer 314. Using thermal control, the wafer 314 is maintained at a temperature of between 0 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the controller 340 may be one of any form of general purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

The invention can be practiced in other etch semiconductor processing systems where the processing parameters may be adjusted to achieve acceptable characteristics by those skilled in the art by utilizing the teachings disclosed herein without departing from the spirit of the invention.

Although the forgoing discussion referred to fabricating of the gate structure of a field effect transistor, fabricating of the other structures and features used in the semiconductor integrated circuits and devices can benefit from the invention.

What is claimed is:

1. A method of fabricating a gate structure of a field effect transistor on a semiconductor substrate comprising a channel region formed between source and drain regions of said transistor, comprising:
   (a) providing a film stack comprising a gate dielectric layer and a gate electrode layer sequentially formed upon the substrate;
   (b) forming a hard mask on the gate electrode layer, wherein the hard mask comprises a metal;
   (c) plasma etching the gate electrode layer; and
   (d) plasma etching contemporaneously the gate dielectric layer and the hard mask.

2. The method of claim 1 wherein the hard mask has a thickness in a range between 100 to 300 Angstroms.

3. The method of claim 1 wherein the hard mask comprises at an oxide of a metal.

4. The method of claim 1 wherein the hard mask comprises at least one of Al, Ti, W, and Ta.

5. The method of claim 1 wherein the hard mask comprises at least one $HfO_2$ and $HfSiO_2$.

6. The method of claim 1 wherein:
   the gate electrode layer comprises polysilicon; and
   the gate dielectric layer comprises at least one of $HfO_2$ and $HfSiO_2$.

7. The method of claim 1 wherein the step (b) uses a plasma comprising at least one of Ar and $O_2$.

8. The method of claim 1 wherein the step (b) comprises:
   providing Ar at a rate of 10 to 200 sccm, $Cl_2$ at a rate of 10 to 200 sccm, and CO at a rate of 10 to 200 sccm.

9. The method of claim 1 wherein the step (c) comprises:
   providing HBr at a rate of 20 to 300 sccm, $Cl_2$ at a rate of 20 to 300 sccm, and $N_2$ at a rate of 0 to 200 sccm.

10. The method of claim 1 wherein the step (d) comprises:
    providing $Cl_2$ at a rate of 2 to 300 sccm and CO at a rate of 2 to 200 sccm.

11. The method of claim 1 wherein steps (e) and (d) are performed in a single plasma reactor.

12. The method of claim 1 wherein steps (b), (c), and (d) are performed in a single plasma reactor.

13. The method of claim 1 wherein step (d) further comprises:
    (d1) forming a photoresist mask exposing the hard mask; and
    (d2) etching the hard mask using a sputter etch process.

14. The method of claim 13 wherein step (d2) uses a plasma comprising at least one of Ar and $O_2$.

15. The method of claim 13 wherein the sputter etch process of step (d2) comprises:
providing Ar at a rate of 10 to 200 sccm, $Cl_2$ at a rate of 10 to 200 sccm, and CO at a rate of 10 to 200 sccm.

16. A method of fabricating a gate structure of a field effect transistor on a semiconductor substrate comprising a channel region formed between source and drain regions of said transistor, comprising:

(a) providing a film stack comprising a gate dielectric layer formed from at least one of $HfO_2$ $HfSiO_2$ and a gate electrode layer sequentially formed upon the substrate;

(b) forming a hard mask from a layer of at least one of $HfO_2$ and $HfSiO_2$ on the gate electrode layer;

(c) plasma etching the gate electrode layer; and (d) plasma etching contemporaneously the gate dielectric layer and the hard mask.

17. The method of claim 16 wherein said hard mask has a thickness in a range between 100 to 300 Angstroms.

18. The method of claim 16 wherein said gate electrode layer comprises polysilicon.

19. The method of claim 16 wherein step (b) uses a plasma comprising at least one of Ar and $O_2$.

20. The method of claim 16 wherein step (b) comprises:
providing Ar at a rate of 10 to 200 sccm, $Cl_2$ at a rate of 10 to 200 sccm, and CO at a rate of 10 to 200 sccm.

21. The method of claim 16 wherein the step (c) comprises:
providing HBr at a rate of 20 to 300 sccm, $Cl_2$ at a rate of 20 to 300 sccm, and $N_2$ at a rate of 0 to 200 sccm.

22. The method of claim 16 wherein the step (d) comprises:
providing $Cl_2$ at a rate of 2 to 300 sccm and CO at a rate of 2 to 200 sccm.

23. The method of claim 16 wherein steps (o) and (d) are performed in a single plasma reactor.

24. The method of claim 16 wherein steps (b), (a), and (d) are performed in a single plasma reactor.

25. The method of claim 16 wherein step (d) further comprises:

(d1) forming a photoresist mask exposing said hard mask; and (d2) etching said hard mask using a sputter etch process.

26. The method of claim 25 wherein step (d2) uses a plasma comprising at least one of Ar and $O_2$.

27. The method of claim 25 wherein the sputter etch process of step (d2) comprises:
providing Ar at a rate of 10 to 200 sccm, $Cl_2$ at a rate of 10 to 200 sccm, and CO at a rate of 10 to 200 sccm.

28. A computer-readable medium including software that, when executed by a processor, performs a method that causes a reactor to fabricate a gate structure of a field effect transistor on a semiconductor substrate comprising a channel region formed between source and drain regions of said transistor, comprising:

(a) providing a film stack comprising a gate dielectric layer and agate electrode layer sequentially formed upon the substrate;

(b) forming a hard mask on the gate electrode layer, wherein the hard mask (c) plasma etching the gate electrode layer; and (d) plasma etching contemporaneously the gate dielectric layer and the hard mask.

29. The computer-readable medium of claim 28 wherein the hard mask has a thickness in a range between 100 to 300 Angstroms.

30. The computer-readable medium of claim 28 wherein the hard mask comprises an oxide of a metal.

31. The computer-readable medium of claim 28 wherein the hard mask comprises at least one of Al, Ti, W, and Ta.

32. The computer-readable medium of claim 28 wherein the hard mask comprises at least one $HfO_2$ $HfSiO_2$.

33. The computer-readable medium of claim 25 wherein:
the gate electrode layer comprises polysilicon; and
the gate dielectric layer comprises at least one of $HfO_2$ and $HfSiO_2$.

34. The computer-readable medium of claim 28 wherein step (b) uses a plasma comprising at least one of Ar and $O_2$.

35. The computer-readable medium of claim 28 wherein step (b) comprises:
providing Ar at a rate of 10 to 200 sccm, $Cl_2$ at a rate of 10 to 200 sccm, and CO at a rate of 10 to 200 sccm.

36. The computer-readable medium of claim 28 wherein the step (c) comprises:
providing HBr at a rate of 20 to 300 sccm, $Cl_2$ at a rate of 20 to 300 sccm, and $N_2$ at a rate of 0 to 200 sccm;
applying 200 to 3000 W of a plasma power and 0 to 300 W of a biasing power;
maintaining a wafer temperature at 100 to 500 degrees Celsius; and maintaining a chamber pressure at 2 to 100 mTorr.

37. The computer-readable medium of claim 28 wherein the step (d) comprises:
providing $Cl_2$ at a rate of 2 to 300 sccm and CO at a rate of 2 to 200 sccm.

38. The computer-readable medium of claim 28 wherein steps (c) and (d) are performed in a single plasma reactor.

39. The computer-readable medium of claim 28 wherein steps (b), (c), and (d) are performed in a single plasma reactor.

40. The computer-readable medium of claim 28 wherein step (d) further comprises:

(d1) forming a photoresist mask exposing the hard mask; and (d2) etching the hard mask using a sputter etch process.

41. The computer-readable medium of claim 40 wherein step (d2) uses a plasma comprising at least one of Ar and $O_2$.

42. The computer-readable medium of claim 40 wherein the sputter etch process of step (d2) comprises:
providing Ar at a rate of 10 to 200 sccm, $Cl_2$ at a rate of 10 to 200 sccm, and CO at a rate of 10 to 200 sccm.

* * * * *

UNITED STATES PATENT AND TRADEMARK OFFICE
CERTIFICATE OF CORRECTION

PATENT NO. : 6,759,286 B2
DATED : July 6, 2004
INVENTOR(S) : Kumar et al.

It is certified that error appears in the above-identified patent and that said Letters Patent is hereby corrected as shown below:

Column 4,
Line 56, please change "mtorr" to -- mTorr --.

Column 5,
Lines 22 and 26, please change "mtorr" to -- mTorr --.

Column 6,
Lines 11 and 16, please change "mtorr" to -- mTorr --.
Line 46, before "DPS II module," please insert -- In one embodiment, during etching the hafnium dioxide layer 204 in the --
Line 46, please change "step 118" to -- step 116 --
Line 47, please change "BS" to -- as --

Column 8,
Line 38, delete "at".

Column 9,
Line 13, please change "$HfO_2$ $HfSiO_2$" to -- $HfO_2$ and $HfSiO_2$ --

Column 10,
Line 5, after "the hard mask" please add -- comprises at least one metal --
Line 18, please change "$HfO_2$ $HfSiO_2$" to -- $HfO_2$ and $HfSiO_2$ --
Line 19, please change "claim 25" to -- claim 28 --

Signed and Sealed this

Twenty-second Day of March, 2005

JON W. DUDAS
*Director of the United States Patent and Trademark Office*